(12) United States Patent
Mainguet et al.

(10) Patent No.: US 11,101,423 B2
(45) Date of Patent: Aug. 24, 2021

(54) METHOD OF MANUFACTURING A DEVICE COMPRISING A MATERIAL ACQUIRING AN ELECTRICAL PROPERTY AFTER HAVE BEEN SUBJECTED TO AN ELECTRIC POLARISATION

(71) Applicant: Commissariat A L'Energie Atomique et aux Energies Alternatives, Paris (FR)

(72) Inventors: Jean-Francois Mainguet, Grenoble (FR); Amelie Revaux, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 65 days.

(21) Appl. No.: 16/714,859

(22) Filed: Dec. 16, 2019

(65) Prior Publication Data
US 2020/0194653 A1 Jun. 18, 2020

(30) Foreign Application Priority Data
Dec. 18, 2018 (FR) .................................. 18 73250

(51) Int. Cl.
*H01L 37/02* (2006.01)
(52) U.S. Cl.
CPC .................................. *H01L 37/025* (2013.01)
(58) Field of Classification Search
None
See application file for complete search history.

(56) References Cited

U.S. PATENT DOCUMENTS

| 5,008,541 A | 4/1991 | Audaire et al. |
| 5,036,241 A | 7/1991 | Michaelis et al. |

(Continued)

FOREIGN PATENT DOCUMENTS

| EP | 0 326 973 A2 | 8/1989 |
| EP | 0 371 868 A1 | 6/1990 |
| EP | 1 178 545 A1 | 2/2002 |

OTHER PUBLICATIONS

French Preliminary Search Report dated Oct. 31, 2019 in French Application 18 73250 filed on Dec. 18, 2018 (with English Translation of Categories of Cited Documents), 2 pages.

(Continued)

*Primary Examiner* — Benjamin P Sandvik
(74) *Attorney, Agent, or Firm* — Oblon, McClelland, Maier & Neustadt, L.L.P.

(57) ABSTRACT

Method for manufacturing a device comprising a stack including a first layer comprising electrical conductors electrically insulated from each other, a second electrically conducting layer, a third layer of pyroelectric material, said third layer being arranged between the first layer and the second layer, said method comprising,
  a) producing said stack on a substrate, the material of the third layer not being pyroelectric at this stage,
  b) producing a polarisation layer made of epoxy glue in electrical contact with the electrical conductors in the first layer,
  c) applying polarisation voltage to said third layer such that its material becomes pyroelectric,
  d) exposing the polarisation layer in its second state by ultraviolet radiation so as to make it at least partly electrically insulating.

16 Claims, 7 Drawing Sheets

(56) References Cited

U.S. PATENT DOCUMENTS

| | | | |
|---|---|---|---|
| 7,385,381 B1 * | 6/2008 | Mainguet | G01D 5/2405 324/71.1 |
| 2003/0176004 A1 | 9/2003 | Willing et al. | |
| 2015/0276493 A1 * | 10/2015 | Tsuchiya | G01J 5/34 250/338.3 |
| 2018/0032782 A1 * | 2/2018 | Mainguet | A61B 5/1172 |

OTHER PUBLICATIONS

U.S. Appl. No. 15/900,505, filed Feb. 20, 2018, 2018/0240843 A1, Mainguet, J, et al.
U.S. Appl. No. 16/064,620, filed Jun. 21, 2018, 2019/0012513 A1, Mainguet, J, et al.
U.S. Appl. No. 15/779,738, filed Nov. 28, 2016, Unknown.
U.S. Appl. No. 16/064,759, filed Jun. 21, 2018, 2019/0005296 A1, Mainguet, J, et al.
U.S. Appl. No. 16/041,233, filed Jul. 20, 2018, 2019/0025129 A1, Mainguet, J, et al.
U.S. Appl. No. 16/186,926, filed Nov. 12, 2018, 2019/0148618 A1, Revaux, A, et al.
U.S. Appl. No. 16/207,313, filed Dec. 3, 2018, 2019/0170587 A1, Benwadih, M, et al.
U.S. Appl. No. 16/230,162, filed Dec. 21, 2018, 2019/0195693 A1, Benwadih, M, et al.
U.S. Appl. No. 16/320,172, filed Jan. 24, 2019, Mainguet, J, et al.
U.S. Appl. No. 16/579,327, filed Sep. 23, 2019, Mainguet, J.
U.S. Appl. No. 16/657,493, filed Oct. 18, 2019, Revaux, A, et al.

* cited by examiner

METHOD OF MANUFACTURING A DEVICE COMPRISING A MATERIAL ACQUIRING AN ELECTRICAL PROPERTY AFTER HAVE BEEN SUBJECTED TO AN ELECTRIC POLARISATION

TECHNICAL DOMAIN AND STATE OF PRIOR ART

This invention relates to a method of manufacturing a device comprising at least one layer of material acquiring an electrical property after having been subjected to polarisation, for example comprising a material that becomes pyroelectric by polarisation.

For example in the field of fingerprint sensors and more generally thermal pattern sensors, a pyroelectric effect is used, i.e., the generation of charges due to a temperature variation.

A thermal fingerprint sensor comprises a pixel matrix, each pixel being able to generate charges due to a temperature variation. Each pixel comprises a pyroelectric material between two electrodes, each pixel can be addressed individually so that a charge produced by each pixel can be detected. A fingerprint comprises ridges and valleys and the contact between a pixel and a ridge or a valley causes a temperature variation that is different depending on whether it is ridge or a valley. Preferably, the pixels are heated so prevent a thermal unbalance between the sensor and the surface of the finger PVDF (polyvinylidene fluoride) and its various copolymers such as PVDF-TrFE (tri fluoro ethylene) have pyroelectric properties, these properties appearing after application of a specific polarisation voltage.

Furthermore, one or several transistors can be used in order to control each pixel or group of pixels.

For example, at least three transistors can be used at each pixel to read the voltage: one transistor to amplify the signal, a second transistor to select the pixel and a third transistor to bring the voltage to a known value at the beginning of acquisition.

Figure 1A:
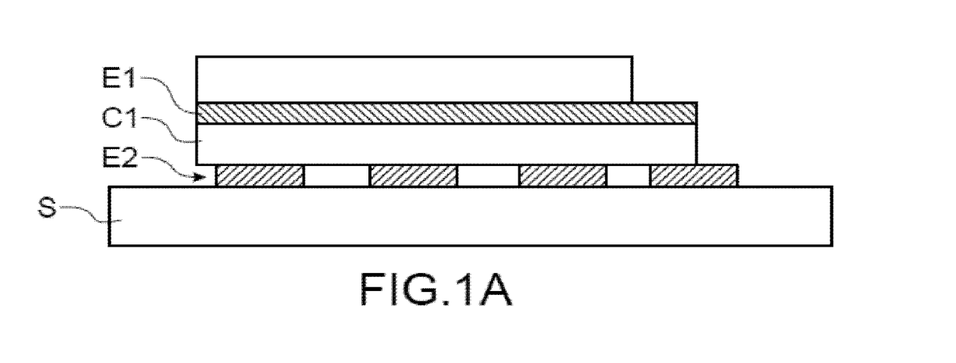
FIG. 1A is a diagrammatic representation of a side view of a stack according to prior art, comprising a PVDF layer to be polarised.

FIG. 1A shows a device according to prior art comprising a substrate S, a layer of PVDF-C1 between a metallic conducting layer forming a common electrode E1 and a plurality of parallel electrically conducting strips forming individual electrodes E2. In another example, the device comprises a PVDF layer between a metallic conducting layer forming a common electrode and a plurality of conducting zones at each pixel.

As indicated above, PVDF becomes pyroelectric after having been polarised. The voltage to be applied to polarise the PVDF is between 75 V and 150 V per μm of PVDF thickness. This polarisation is made between the common electrode and the individual electrodes. Furthermore, if this polarisation has to be made when control transistors are already in place, this voltage level can cause damage or even destruction of the transistors.

Figure 1B:
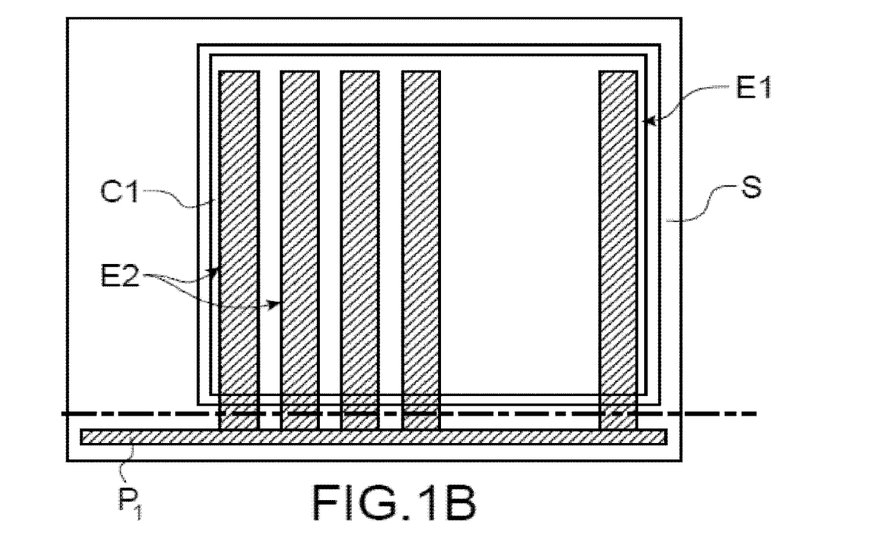
FIG. 1B is a diagrammatic top view of the stack in FIG. 1A.

In order to avoid the need to connect each pixel or group of pixels individually to a polarisation source, all individual electrodes E2 are short circuited before the polarisation step, for example by providing an electric track P1 connecting all individual electrodes as represented on FIG. 1B, which makes it easier to apply a polarisation voltage through the PVDF layer. However, this short circuit must be eliminated before the device can be used, and consequently the electric track is removed after polarisation. This electric track P1 is removed by cutting the substrate (along the dotted line on FIG. 1B), resulting in a loss of material and available space.

It can also result in chips and debris that can disturb correct operation of the device. There is also a risk that the cut is unsuccessful and that the device cannot be used.

In the case of a device with for example one selection transistor per pixel in which the source is connected to the individual electrode E2 of the pixel, the drain is connected to a column and the gate is connected to an electrical selection line, to prevent destruction of the transistor, all transistors in the pixels plane have to be made conducting by applying an adapted gate voltage, and therefore momentarily connecting all gates, and all columns, which makes the process complex.

PRESENTATION OF THE INVENTION

Consequently, one purpose of this invention is to disclose a method of manufacturing a device comprising a material capable of acquiring at least one electrical property, that does not have the disadvantages listed above.

The previously announced purpose is achieved by a manufacturing method using a layer of a material capable of acquiring at least one electrical property after being subjected to polarisation, a common electrode and individual electrodes on each side of the material capable of acquiring the electrical property, and a layer called the polarisation layer in contact with all individual electrodes, the polarisation layer having the property of being electrically conductive, and after application of a specific treatment, of being an electrical insulator.

For example, by using such a polarisation layer in a stack comprising a polyvinylidene fluoride (PVDF) layer, it is possible to simply short circuit all individual electrodes and possibly the transistors, and thus to be able to apply sufficient voltage to polarise the PVDF which then becomes pyroelectric. By applying special treatment to this polarisation layer, it becomes electrically insulating, which eliminates short circuiting of electrodes and possibly transistors, making the device functional.

In other words, the manufacturing method uses a special-purpose layer to polarise the material and confer its electrical property on it, this layer being made non-functional after the material has acquired its electrical property.

For example, such a material would be a cross-linkable glue containing one or more photopolymerisation initiation salts, such as LP 655 epoxy glue made by DELO. The salts present in the formulation assure ion conduction that disappears after UV exposure, which makes the glue electrically insulating after cross-linking under UV.

In one example, the polarisation layer is arranged between the layer of material to be polarised and the individual electrodes. More advantageously, the layer is arranged between the substrate and the individual electrodes, which limits interactions between the material to be polarised, for example PVDF and the material of the polarisation layer, the long term effects of which are not known.

In order to make this short circuit, all that is necessary is to make a solid plate polarisation layer. Advantageously, the polarisation layer can be localised.

The method according to the invention has the advantage of not requiring a cutting step or any other step that might pollute the device. Short circuits are eliminated simply. Application of ultraviolet radiation in the case of LP 655 glue has no harmful effect on other components of the device.

According to another characteristic, contact pads are provided to at least verify if the polarisation layer has actually become electrically insulating after treatment.

The method according to the invention is advantageously used in the manufacturing of thermal pattern sensors, and particularly fingerprint sensors.

The invention is particularly interesting for devices making use of transistors, since transistors are being increasingly small and more and more sensitive to the electric field. Short circuiting through the polarisation layer effectively protects them.

The application describes a method for manufacturing a device comprising a stack including a first layer comprising at least two electrical conductors electrically insulated from each other, a second layer comprising at least one electrical conductor, at least one third layer of material with at least one electrical property, said third layer being arranged between the first layer and the second layer, said method comprising:

a) a step to produce a stack on a substrate comprising the first layer, the second layer and the third layer of a material that, after electrical polarisation, becomes said material with said electrical property, the first layer and the second layer being arranged relative to each other so as to apply a polarisation voltage within the third layer, b) a step to produce a polarisation layer in electrical contact with the at least two electrical conductors in the first layer, said polarisation layer comprising a material that has a first state in which it is electrically conducting and a second state in which it is electrically insulating, the change from the first state to the second state being obtained by application of a treatment to said polarisation layer, said polarisation layer being made so that it is initially in its first state, c) a step in which a polarisation voltage is applied to said third layer such that its material has said electrical property, d) a step to apply said treatment transforming at least part of the material of the polarisation layer in its second state, such that said at least two electrical conductors in the first layer are electrically insulated from each other.

The application also describes a method of manufacturing a thermal patterns sensor comprising the manufacture of a device comprising a stack using the method according to the invention, the step to produce electrical conducting lines forming a heat source on said stack, and a step to produce an encapsulation layer.

The application also describes a stack to make a device comprising at least one first layer comprising at least two electrical conductors electrically insulated from each other, a second layer comprising at least one electrical conductor, a third layer made of a material with at least one electrical property after electrical polarisation, said third layer being located between the first layer and the second layer, said stack being obtained using the manufacturing method according to the invention, said stack comprising the first layer, the second layer, the third layer, the material of the third layer not having said electrical property and a polarisation layer made of a material with a first state in which it is electrically conducting and a second state in which it is electrically insulating, the change from the first state to the second state being obtained by applying a treatment to said second material, said polarisation layer being made so that it is initially in its first state, said polarisation layer being in electrical contact with the electrical conductors in the first layer.

BRIEF DESCRIPTION OF THE DRAWINGS

This invention will be better understood after reading the following description and the appended drawings on which:

FIG. 7B is a sectional view along plane A-A in FIG. 7A, FIG. 8A and FIG. 8B are diagrammatic representations of two other example embodiments of stacks produced according to the invention making use of transistors.

DETAILED PRESENTATION OF PARTICULAR EMBODIMENTS

In the following description, the invention will be described principally in the framework of manufacturing of a stack comprising PVDF so as to make it pyroelectric, with a view towards an application in making fingerprint sensors, and more generally making heat sensors. But the invention can be applied to any device for which manufacturing requires a polarisation step to confer an electrical property on a material, examples of which are given below.

In the following description, an insulating or conducting material is an electrically insulating or conducting material respectively, unless explicitly mentioned otherwise.

The manufacturing method according to the invention comprises the following steps:

make a stack comprising a material capable of acquiring at least one electrical property and arranged between a common electrode and at least two individual electrodes, production of a polarisation layer making a short circuit between individual electrodes and possibly the transistors. The polarisation layer may for example be made using a printing or coating process chosen as a function of the viscosity of the material used in the layer. The polarisation layer is made for example by roller coating, slit die coating, or screen printing, application of a polarisation to the layer capable of acquiring the electrical property using the polarisation layer, application of a treatment to make the polarisation layer electrically insulating.

Figure 2:
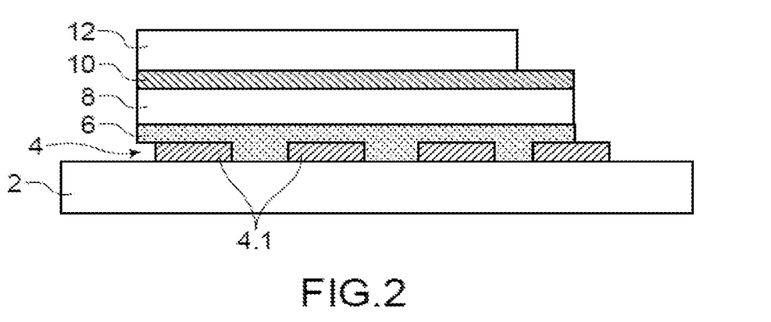
FIG. 2 is a diagrammatic representation of a side view of a stack according to the invention, comprising a PVDF layer to be polarised.

In this application, "electrical property" of a material means a property by which the material is capable of generating a voltage or a current, for example when a temperature variation is applied to it (pyroelectricity), or when it is deformed (piezoelectricity), or when it is the source of permanent polarisation after having been polarised, such as electrets. FIG. 2 shows an example embodiment EP1 obtained using an example of the polarisation method according to the invention. This stack can be used to make a fingerprint sensor.

Stack EP1 comprises a substrate 2, a layer 4 comprising a plurality of parallel electrically conducting strips 4.1 that will form individual electrodes, in this order. The stack EP1 comprises a polarisation layer 6, a layer 8 of a material that can have pyroelectric properties under the effect of a polarisation, an electrically conducting layer 10 that is intended to form a common electrode facing the individual electrodes. In the example shown, a layer 12 is formed on layer 10, with the purpose of protecting the stack.

The pyroelectric material of the layer 8 may for example be a polyvinylidene fluoride or PVDF, a polyvinylidene fluoride-trifluoroethylene or P(VDF-TrFE), a ceramic such as PZT (lead zirconate titanate), crystals such as those known under the acronym TGS (Tris Glycine SDF) or LiTaO$_3$ crystals.

The common electrode 10 is connected to a given voltage, for example to the ground.

The substrate may for example be an electric insulator, for example made of a rigid material such as glass, or a flexible material such as polyethylene (PET), polyethylene naphthalate (PEN), polyurethane (PU) or polydimethyl siloxane (PDMS).

As a variant, the device can be manufactured from a CMOS on silicon substrate or silicon on insulator (S01) substrate technology.

In this application, "individual electrode" means an electrode that will form at most some of the pixels, in cooperation with the common electrode. In the example in FIG. 1B, each individual electrode forms a column type pixel with the PVDF and the common electrode. In other examples, heating lines are formed perpendicular to the individual electrodes, the intersection of a heating line and an individual electrode being considered as a pixel.

The polarisation layer 6 comprises a material that has a state in which it is electrically conducting and a state, after application of a given treatment, in which it is electrically insulating.

In this application, "electrically conducting" means a material that is sufficiently conducting to short circuit the electrodes and/or transistors, and to enable application of a sufficient polarisation voltage to make the material of the layer 8 pyroelectric in a few seconds up to 1 minute. A material that is only slightly electrically conducting may be sufficient.

"Electrically insulating material" means a material sufficiently insulating so that the quantity of charges produced at a pixel can be detected separately from charges generated at other pixels. For example, an attempt is made to circulate current in the polarisation layer after treatment equal to about at least 100 times less than the circulation in the individual electrodes.

The material in the polarisation layer 6 is a cross-linkable glue containing one or several cross-linking initiation salts, for example an epoxy glue. For example, cationic photoprimers such as diaryliodonium or triarylsulfonium salts are cross-linking initiation salts suitable for this invention.

The initiation salt is an ion conductor, which makes the material slightly electrically conducting after cross-linking. After cross-linking, the material becomes electrically insulating. The epoxy glue produced by the DELO company may for example be a glue for which salts added in the formulation are photopolymerisation initiating salts under UV.

For example, the polarisation layer comprises LP655 epoxy glue manufactured by DELO that changes from a conducting state to an electrically insulating state by cross-linking under exposure by ultraviolet (UV) radiation at a wavelength of the order of 365 nm.

For example, the thickness of the polarisation layer 6 varies from about a hundred nm to a few µm.

Figure 10:
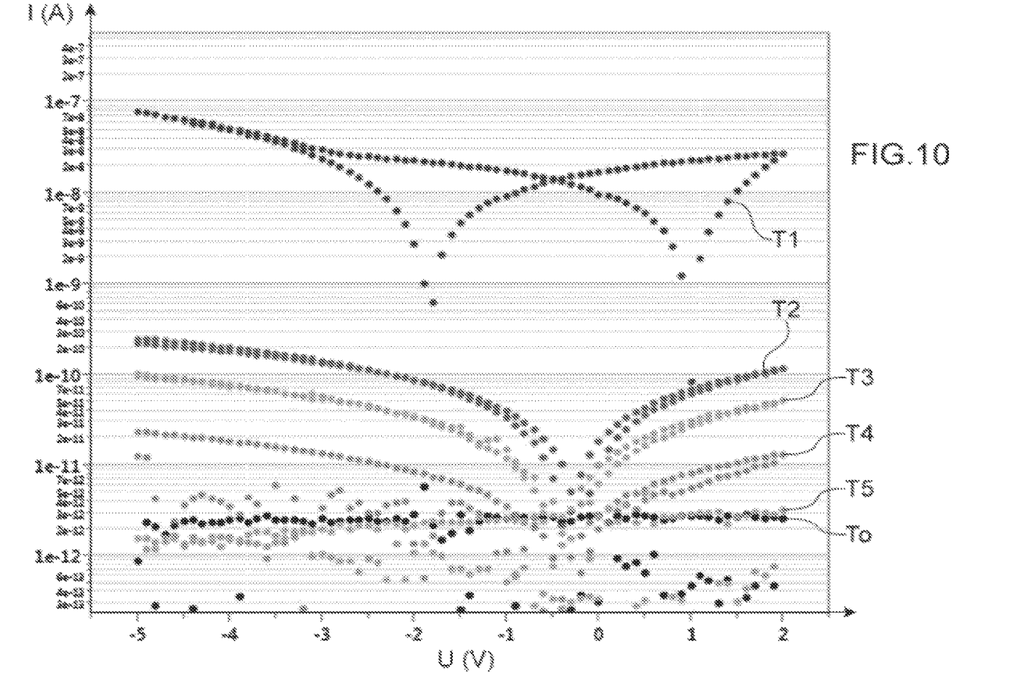
FIG. 10 is a graphic representation of the variation of the current I as a function of the voltage U in a polarisation layer after different exposure durations.

FIG. 10 illustrates the variation of the electrical conductivity as a function of the level of cross-linking of the LP655 glue. It represents the variation of the current I in Amperes between two conducting bars connected by a drop of LP655 glue as a function of the voltage U in Volts.

Each curve represents an electrical conductivity for a cross-linking time under UV.

Curve To corresponds to rods without an LP655 drop, the current does not pass. T1, corresponding to a cross-linking time of 60 s, corresponds to the current circulating between the conductors with a drop of uncross-linked LP 655 glue and therefore conducting relatively well. Curves T2 to T5, in order, correspond to increasingly cross-linked states (increasing cross-linking time under UV), becoming less and less conducting. It is found that the electrical conductivity for the longest cross-linking time T5 is practically identical to the conductivity To, i.e., without a drop. Therefore, the material of the layer 6 for a cross-linking time corresponding to T5 is completely insulating.

The polarisation layer 6 extends so as to be in contact with all individual electrodes, so as to short circuit all individual electrodes. The polarisation layer 6 does not necessarily cover the individual electrodes entirely.

Figure 5:
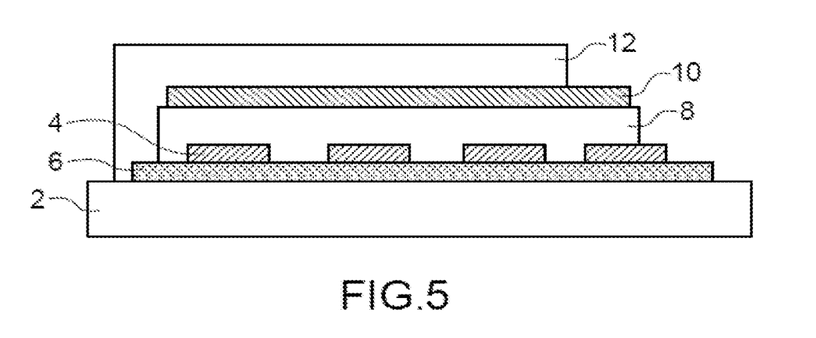
FIG. 5 is a diagrammatic representation of a side view of another example of a stack according to the invention, comprising a PVDF layer to be polarised.

FIG. 5 shows a stack obtained using an example of the manufacturing method. When producing stack EP2, the polarisation layer 6 is formed between the substrate 2 and the individual electrodes.

The polarisation layer 6 makes the connection between all individual electrodes. The PVDF layer is formed on individual electrodes. Due to the manufacturing process, it is also deposited between the individual electrodes and is in contact with the polarisation layer 6.

The PVDF layer is then made pyroelectric. To achieve this, a polarisation voltage is applied between the common electrode 10 and one of the individual electrodes, or even between the common electrode and the polarisation layer, to apply a sufficient voltage to make the PVDF pyroelectric. For example, for a 3 µm thick PVDF layer, the polarisation voltage is of the order of 300 V for a few seconds.

The PVDF zones located facing individual electrodes are made pyroelectric.

This example is particularly advantageous, because it is very easy to make the polarisation layer on the substrate, and does not require any structuring of the substrate.

Furthermore, the polarisation layer 6 thus arranged does not create any additional capacitance between the individual electrodes and the common electrode. Furthermore, during the treatment, the entire polarisation layer is made electrically insulating, for example by performing a UV treatment through the chosen substrate transparent to UV.

FIG. 2 shows a stack obtained using a manufacturing method according to another example.

In this example, the polarisation layer 6 is formed on the individual electrodes 4.1. The polarisation layer is such that it can be used to connect all individual electrodes. In the example in FIG. 2, the polarisation layer 6 only partially covers the individual electrode located at the right end in the representation shown in FIG. 2, but this partial coverage is sufficient to connect it to the other individual electrodes.

The PVDF layer is then made pyroelectric. To achieve this, a polarisation voltage is applied between the common electrode 10 and one of the individual electrodes, or even between the common electrode and the polarisation layer, to apply a sufficient voltage to make the PVDF pyroelectric. For example, for a 3 µm thick PVDF layer, the polarisation voltage is of the order of 300 V.

Use of the polarisation layer makes it easy to apply a polarisation voltage in a single step to all PVDF zones, particularly those locating facing the individual electrodes.

During a next step and in order to make the device functional, a treatment is applied to the polarisation layer 6 in order to make it completely electrically insulating. If the polarisation layer is made of LP 655 epoxy glue, it is cross-linked by UV exposure with a wavelength of the order of 365 nm. The exposure duration is chosen to assure that the electrical conductivity of the glue is weak enough to be considered as insulating, and such that the individual electrodes are no longer electrically connected to each other. The exposure duration is also sufficient so that the glue performs an adhesive function and that it is sufficiently hard. For example, the PVDF is typically polarised by applying an electric field of 100 volts for a 1 µm PVDF layer. In the case of a 3 µm PVDF layer, an electric field of about 300 volts is applied.

For example, the polarisation layer is exposed through the substrate that is chosen to be transparent to UV radiation, for example it may be made of glass or plastic, and through the individual electrodes that are chosen to be thin enough to be transparent to UV radiation.

As a variant, the UV exposure is made through the common electrode when the material of the common electrode is sufficiently transparent to UV radiation, which for example is the case for an organic common electrode, for example made of PEDOT:PSS (mixture of poly(3,4-ethylenedioxythiophene) (PEDOT) and sodium polystyrene sulfonate (PSS)).

After exposure, the entire polarisation layer 6 is made insulating.

The presence of the polarisation layer 6 that is now electrically insulating adds a capacitance in series, reducing the total capacitance of the pixel, which does not significantly disturb functioning of the device in the case of a read in charge. In the case of a read in voltage, its presence can be advantageous because the voltage produced is increased for the same quantity of charge because the total capacitance of the pixel is reduced. The detection sensitivity is then increased.

Furthermore the presence of this insulating layer in contact with the PVDF makes it possible to further reduce the leakage current through the PVDF, which is already low because of the very good electrical insulation provided by the PVDF.

Figure 3:
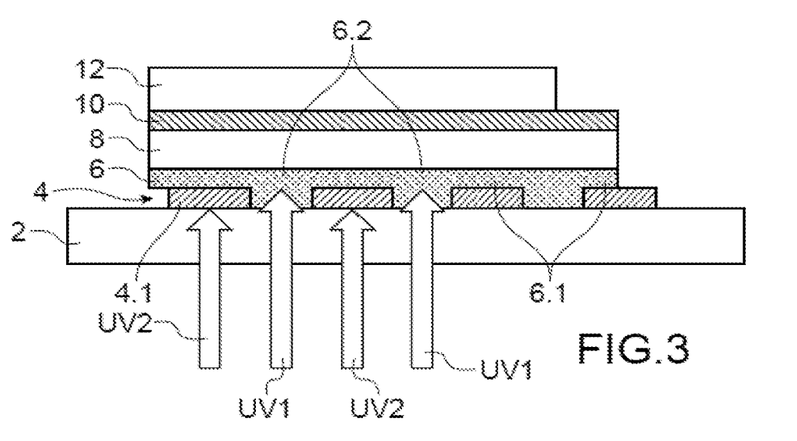
FIG. 3 is a diagrammatic representation of the stack in FIG. 2, in an example of a treatment step intended to make the polarisation layer insulating.

FIG. 3 shows an example embodiment in which the polarisation layer does not create any additional capacitance.

To achieve this, a substrate 2 is chosen, sufficiently transparent to UV radiation, such as glass or a plastic material, to enable exposure through the substrate, as is shown diagrammatically by the UV arrows, and individual metallic electrodes are chosen sufficiently thick to be not transparent to UV. Rays UV1 expose the polarisation layer 6, and rays UV2 are stopped by the electrodes 4.1. The result is that at the end of the exposure step, the polarisation layer 6 keeps conducting zones 6.1 facing the individual electrodes, separated by insulating zones 6.2 between individual electrodes. The conducting zones 6.1 form a prolongation of individual electrodes, in the direction of the thickness of the electrodes.

Figure 4:
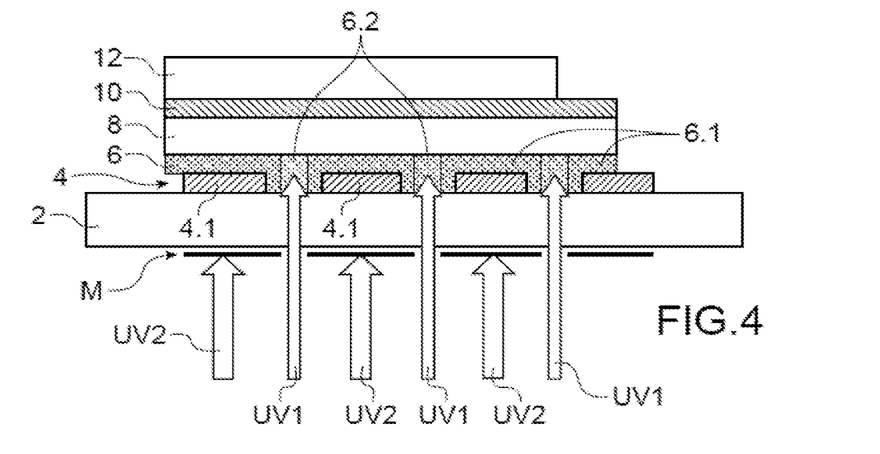
FIG. 4 is a diagrammatic representation of the stack in FIG. 2, in another example of a treatment step intended to make the polarisation layer insulating.

FIG. 4 shows a variant of the method in FIG. 3 in which a mask M is used during the cross-linking phase to mask the polarisation layer from UV radiation. In this example, the mask M is arranged under the substrate and is facing each individual electrode. As a variant, the mask is arranged above the common electrode when the exposure is made through the common electrode. For example, the mask is used when individual electrodes are too transparent to UV rays to prevent cross-linking. The mask is similar to masks commonly used in microelectronic processes. The polarisation layer 6 is exposed by Rays UV1, and rays UV2 are stopped by the mask. After treatment, the polarisation layer 6 comprises electrically insulating portions 6.2 that electrically insulate the individual electrodes 4.1.

As for FIG. 3, the result is a polarisation layer alternating electrically conducting zones from electrically insulating zones.

It will be understood that the treatment depends on the material in the polarisation layer. In the case of an exposure, it will be made at a wavelength at which the material can be cross-linked, which may be different from the wavelength of a UV radiation.

Figure 6:
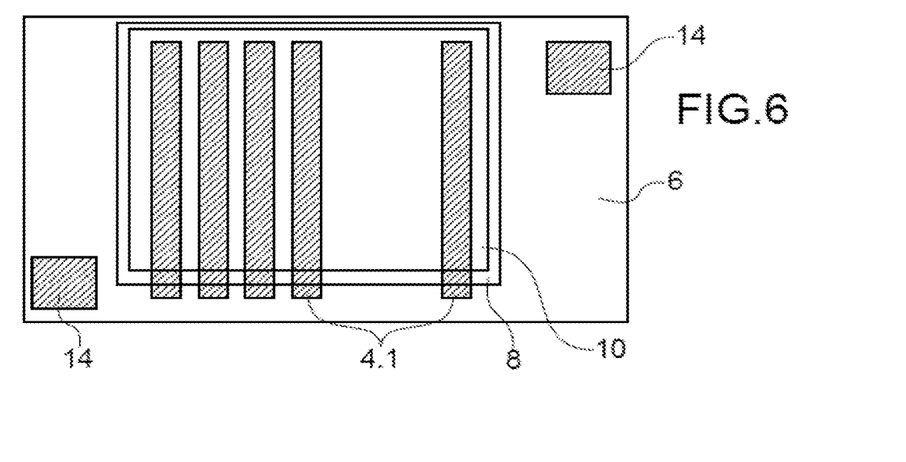
FIG. 6 is a diagrammatic representation of a side view of a variant embodiment shown in FIG. 5 making use of contact pads.

FIG. 6 shows a top view of the stack EP3 seen from above, obtained with a method according to another example embodiment, comprising means of verifying that the individual electrodes are actually electrically insulated from each other after treatment of the polarisation layer.

On FIG. 6, two electrical contact pads 14 are formed in the polarisation layer 6 outside the stack with the PVDF layer, and on each side of the stack in the plane of the polarisation layer. For example, by applying a voltage between the pads 14, a current higher than a given threshold is measured if the polarisation layer is electrically conducting, and a current lower than the given threshold is measured if the polarisation layer is insulating.

The contact pads 14 are also used to measure conduction of the polarisation layer before polarisation of the PVDF and to check that it is sufficiently conducting, one of the contact pads can be used with the common electrode, to apply the polarisation voltage to the PVDF layer.

Figure 7A:
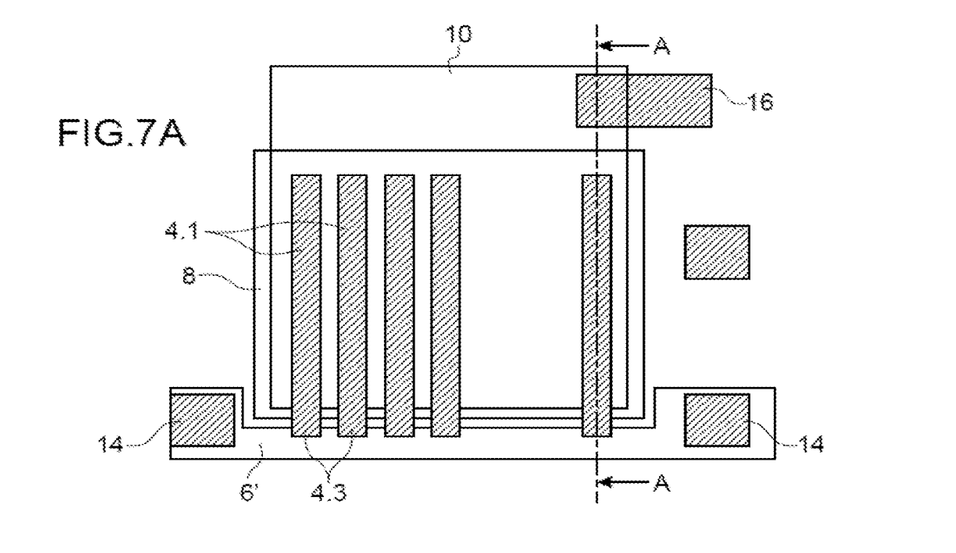
FIG. 7A is a diagrammatic representation of a top view of another example embodiment of a stack according to the invention.

FIG. 7A shows another example embodiment in which the polarisation layer 6 is localised, i.e., it is not a layer deposited over the whole wafer surface. In the example represented, it is formed at the longitudinal ends 4.3 of the individual electrodes.

For example, the polarisation layer is made using a mask to deposit the glue locally, unlike previous example embodiments in which the glue is deposited over the whole wafer surface. In the example represented, the polarisation layer is in strip form. As a variant, the polarisation layer can be in any other form provided that it can be in contact with all individual electrodes 4.1.

In this example, the localised polarisation layer is deposited between the substrate and the individual electrodes, as in the example in FIG. 5. The remainder of the stack accommodates this localised overthickness. This example embodiment reduces the quantity of material used to make the polarisation layer.

In the example represented on FIG. 7A and advantageously, the common electrode 10 extends by a contact 16 that rests on the substrate 2, and that enables connection of the common electrode 10 to the ground or to a fixed potential. The connection, for example by welding, is facilitated because the contact 16 is made resting on a rigid element, i.e., the substrate made of glass or another rigid material, unlike PVDF.

Figure 7B:
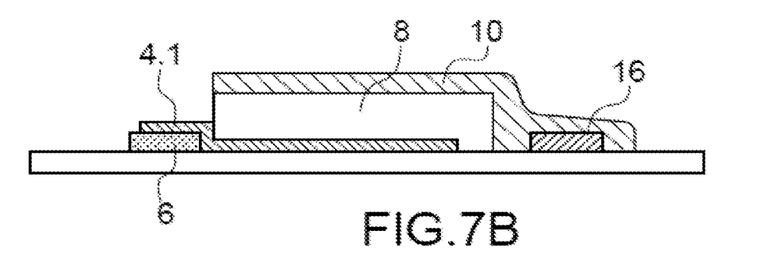

FIG. 7B shows a sectional view of the stack in FIG. 7A along plane A-A. One end of electrode 4.1 can be seen on the polarisation layer 6'. Advantageously, the surface of the PVDF layer is chosen such that the contact 16 of the common electrode 10 is made at a sufficient distance from the individual electrode 4.1, to reduce the risks of a short circuit between the common electrode 10 and the individual electrode 4.1. The use of a PVDF layer with a large surface area also makes it possible to insulate contacts of heating lines that might be formed on the stack.

As a variant, the polarisation layer is deposited between individual electrodes and the PVDF layer.

In this example, contact pads 14 are connected to the two ends of the polarisation layer as for the example in FIG. 6, and are used to verify the electrical conductivity of the polarisation layer before and/or after the treatment.

As a variant, the contact 16 and the common electrode 10 are brought into contact by a portion of the same material as the polarisation layer 6, so as to make a temporary connection.

In the case of the stack in FIG. 7A, the polarisation layer can be exposed directly from above, or from below through the substrate. Thus, at least the zones in the polarisation layer between the individual electrodes are made electrically insulating and interrupt the short circuit between the electrodes.

If the electrodes mask the polarisation layers from UV, only the areas of the polarisation layer faced the individual electrodes are not made insulating, but functioning of the device is not disturbed.

Preferably, a substrate transparent to UV rays is chosen and exposure is made from the back face through the substrate so that the entire polarisation strip can be exposed.

Figure 8A:
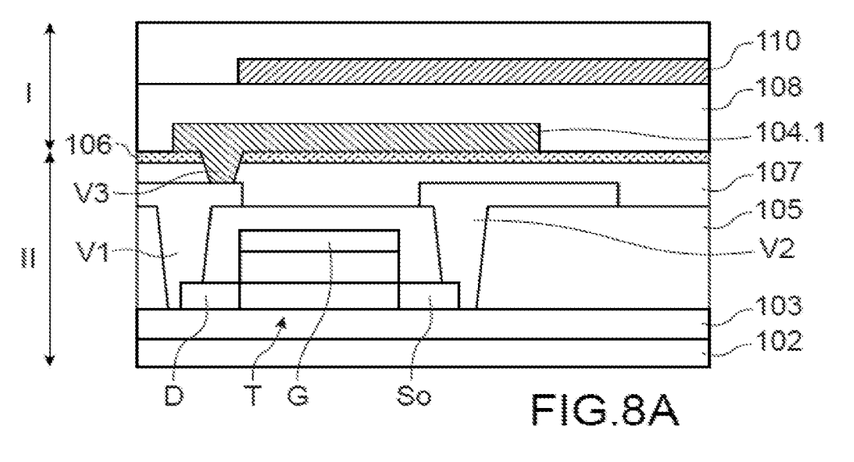
Figure 8B:
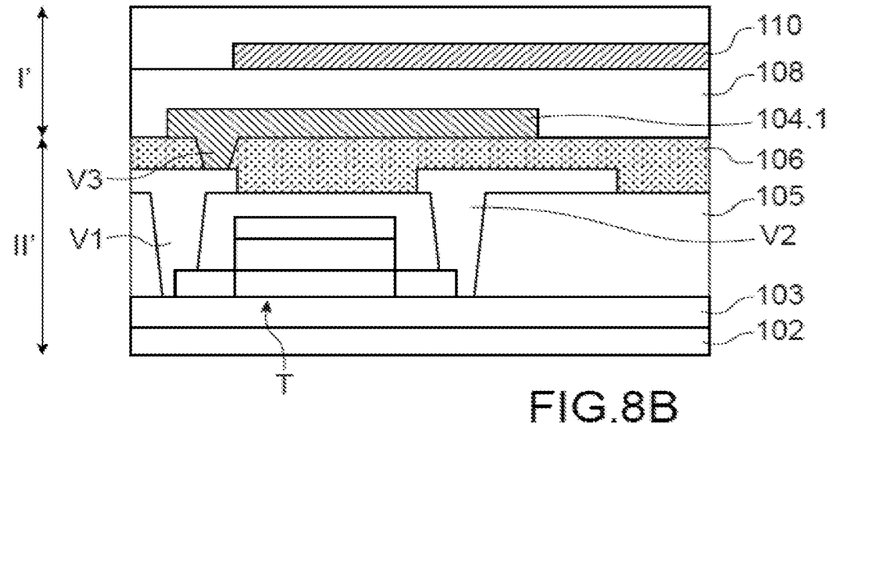

FIGS. 8A and 8B show example embodiments of fingerprint sensors, or more generally thermal pattern sensors comprising a detection part I and an electronic part using transistors.

The electronic part comprises transistors T, for example one transistor per pixel, each individual electrode then being connected to a transistor.

For example, the electronic part comprises a support substrate 102, for example made of glass, a layer 103 for example made of polyimide, for example 15 µm to 20 µm thick, transistors T, for example thin film transistors TFT made for example from IGZO (indium-gallium-zinc oxide), an SiN layer 105, and vias V1 and V2 through the SiN layer, making contact with the drain D and the source So. The gate G comprises a connection opening up on the edge of the device. Each drain D is connected to a lower electrode 104.1 through a via V3.

The device also comprises an insulating interface layer between the electronic part and the detection part I, for example a polymer layer.

The PVDF layer 108 is arranged between the common electrode 110 and the individual electrodes 104.1.

The device also comprises a polarisation layer 106 on the interface layer and under the individual electrodes and in contact with them. All individual electrodes 104 are connected together through the polarisation layer 106. Furthermore, the drains D are connected to the polarisation source 106 through the via V3.

The transistors are distributed in rows and in columns. All transistors in a column are connected through their source So and all transistors in a row are connected through their gate, called the selection row.

Source columns and gate rows open up on the sides of the stack. Advantageously, it is possible to connect firstly all sources together and secondly all gates together, with the polarisation layer 106 or one or several other polarisation layers. During polarisation of the PVDF, the drains, sources and gates are all connected to the earth.

This example polarisation is particularly interesting because the polarisation layer makes it possible to reach individual electrodes that are normally buried in the stack. Thus, the PVDF can be polarised by applying a voltage to individual electrodes through the polarisation layer that is accessible from one side of the stack.

FIG. 8B shows a particularly advantageous example in which the polarisation layer 106 is interposed between the electronic part II and the detection part I. The polarisation layer 106 is in contact with the vias V1, V2 and V3. The individual electrodes 104.1, the sources So and the drains D are then short circuited through the layer 106. As in the example in FIG. 8A, gate rows open up on the sides of the stack. It is possible to connect all gates together, due to the polarisation layer 106 or one or several other polarisation layers, and to connect them to the earth. During polarisation of the PVDF, the drains, sources and gates are all connected to the earth.

According to one advantageous variant, a via is provided at the gate that opens up in the polarisation layer, so that the gate, the drain and the source can be simultaneously short circuited. Since all gates in each selection row are connected, a single via between one gate in a row and the polarisation layer is sufficient. The via may for example be made at the end of a row.

We will now give an example of a practical embodiment illustrating the feasibility of the method according to the invention.

Figure 9:
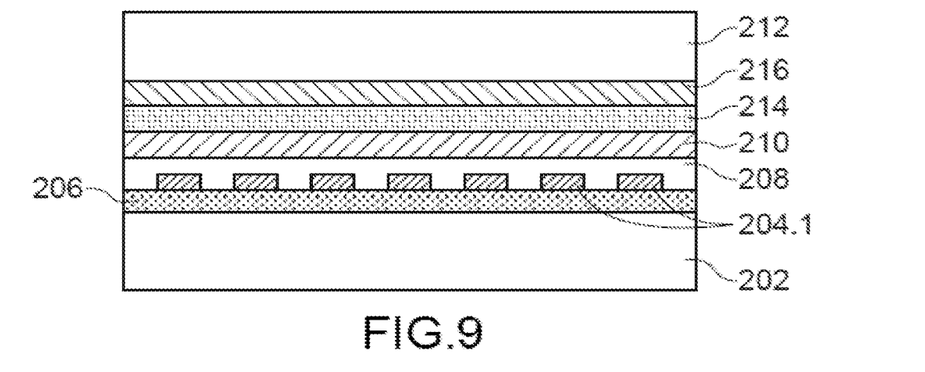
FIG. 9 is a diagrammatic representation of another example embodiment of a stack according to the invention making use of transistors.

We will consider the fingerprint sensor in FIG. 9 that comprises a substrate 202, a polarisation layer 206 directly on the substrate 202 that can cover the substrate entirely as shown on FIG. 9 or can be localised, individual electrodes 204.1 for example made of a 50 nm thickness of gold, a layer 208 of P(VDF-TrFE) for example between 2 µm and 3 µm thick, a layer 210 deposited over the whole wafer surface forming the common electrode, for example 0.3 µm of PEDOT:PSS, a dielectric layer 214 for example made of polyimide with a thickness of the order of 0.2 µm, conducting rows 216 oriented at a right angle from the individual electrodes 204.1, and forming heating means. The conducting rows may for example be made from a 1 µm thickness of silver or a 50 nm thickness of gold, and an encapsulation layer 212.

The individual electrodes and the conducting rows are finely structured at the pitch of the pixels. For example, a matrix of 128×128 pixels with a 90 µm pitch is made, individual electrodes are then made with a width of 60 µm at a spacing of 30 microns. There are 128 metallic tracks perpendicular to the electrodes with a thickness of 128 and a width of 45 µm at a spacing of 45 µm.

We will determine the capacitance of the individual electrode—PVDF-common electrode stack.

The surface area of the capacitance is equal to:

$$128 \text{ columns} \times 60 \times 10^{-6} \times (128 \times 90 \times 10^{-6}) = 88.4 \times 10^{-6} \text{ m}^2.$$

The PVDF layer is 3 µm thick.

The relative permittivity $\varepsilon_r$ of the P(VDF-TrFE) is between 10 and 12.

The permittivity of a vacuum $\varepsilon_0$ is $8.85418782\times10^{-12}$ m$^{-3}$ kg$^{-1}$s$^4$A$^2$.

The capacitance of the stack is then equal to:

$$C=8.85\times10^{-12}\times10\times88.4\times10^{-6}/3\times10^{-6}= 2.610^{-9}F=\text{namely } 2.6 \text{ nF.}$$

We will determine the time necessary for the electric field to be set up to polarise the P(VD-TrFE), in other words the charge time of the capacitance through the access resistance R.

The P(VDF-TrFE) is considered to be fully insulating.

A few seconds of polarisation of an electric field of the order of 100 volts per micron is sufficient to make the P(VDF-TrFE) pyroelectric.

To charge a capacitance of 2.6 nF in one second, the time constant 1/RC tells us that the access resistance must not be higher than R=380 MΩ.

At 300 volts, this corresponds to an momentary current of $5\times10^{-7}$ A through the resistance R.

On FIG. 10, it can be seen that currents circulating in the glue layer before polymerisation (curve T1) are of the order of $10^{-7}$ to $10^{-8}$ A with a voltage of a few volts, for example 5 volts, which makes a resistance of 50 MΩ to 500 MΩ, which is compatible with the access resistance; the times can easily be adapted.

Consequently, the use of a polarisation layer as described can make the P(VDF-TrFE) pyroelectric in a reasonable time.

We will now show that polymerisation of the polarisation layer is sufficient for the sensor to function.

For example for the measurements, the device is connected to a Texas Instruments DDC264® (64 channels, 20 bit ADC) analogue converter, and an EVM board with the same name with 256 inputs.

The measured noise is of the order of 0.5 to 1 fC. It saturates at 12.5 pC in the most sensitive mode. The following orders of magnitude are deduced:

we would like to read at least 6250 e$^-$=6250×1.6.×$10^{-19}$=1 fC, to obtain 8 bits, we would like to read: 1600000 e$^-$=256 fC (8 bit: 256 times the minimum), we would like to not exceed 78 000 000 e$^-$=12.5 pC to prevent saturation of the device.

The pyroelectric coefficient of P(VDF-TrFE) is of the order of $29\times10^{-6}$ C/m$^2$/K We would like to measure the temperature difference between a pixel in contact with the skin and a pixel in contact with air.

It has been estimated that the quantity of charges to be generated to have a usable result is about 200 fC.

Read times are of the order of one millisecond, i.e. the time for the thermal signal to propagate to the P(VDF-TrFE).

The average current circulating in a column electrode to reach the read electronics is of the order of $200\times10^{-15}/10^{-3}=2\times10^{-10}$ A (0.2 nA).

We would like electrical insulation with a factor of at least 100, namely a current less than $2\times10^{-12}$ A. On FIG. 10, it can be seen that this is the order of magnitude of the current circulating in the polymerised glue.

Therefore the polymerised glue is sufficiently insulating to assure functioning of the device.

It will be understood that the individual electrodes can have any shape.

It will be understood that the different example embodiments can be combined. For example, the polarisation layer on the individual electrodes relative to the substrate can only be made on the longitudinal ends of electrodes in columns.

The fact of having the common electrode on the pyroelectric material has the advantage of shielding the device against electrical parasites from the finger, in an application to a fingerprint sensor.

Furthermore, in all the examples, the common electrode is on the pyroelectric material relative to the substrate. According to other examples, it is located under the pyroelectric material on the side of the substrate, and the individual electrodes are on the pyroelectric material.

Furthermore, it can be envisaged that the common electrode has one electrode for each individual electrode, said electrodes being connected to a fixed voltage.

It will be understood that the invention can be applied to a stack in which several polarisation layers are used.

The manufacturing method can be used to manufacture thermal pattern sensors, for example fingerprint sensors, cameras making use of PVDF.

This invention is applicable to other materials capable of acquiring an electrical property after being polarised. For example, the invention is applicable to materials that can become piezoelectric under the application of a voltage: PVDF and PZT also become piezoelectric when a polarisation voltage is applied to them.

The invention is also applicable to electrets. An electret is a dielectric material that remains permanently electrified after a temporary electric field has been applied to it. For example, such a material can be formed from polymers, for example in the VHB® family, and advantageously VHB4910®.

Piezoelectric devices thus made can be used as "pressure" or ultrasonic fingerprint sensors, the piezoelectric material is then used as an ultrasound emitter, the same piezoelectric material may or may not be used as a receiver.

Piezoelectric devices thus made can also be used as actuators.

The invention claimed is:

1. Manufacturing method for manufacturing a device comprising a stack including a first layer comprising at least two electrical conductors electrically insulated from each other, a second layer comprising at least one electrical conductor, at least one third layer of material with at least one electrical property, said third layer being arranged between the first layer and the second layer, said method comprising:
   a) producing a stack on a substrate comprising the first layer, the second layer and the third layer of a material that, after electrical polarisation, becomes said material with said electrical property, the first layer and the second layer being arranged relative to each other so as to apply a polarisation voltage within the third layer,
   b) producing a polarisation layer in electrical contact with the at least two electrical conductors of the first layer, said polarisation layer comprising a material that has a first state in which it is electrically conducting and a second state in which it is electrically insulating, the change from the first state to the second state being obtained by application of a treatment to said polarisation layer, said polarisation layer being made so that it is initially in its first state,
   c) applying a polarisation voltage to said third layer such that its material has said electrical property,
   d) applying said treatment transforming at least part of the material of the polarisation layer in its second state, such that said at least two electrical conductors in the first layer are electrically insulated from each other.

2. Manufacturing method according to claim 1, wherein the material of the third layer becomes pyroelectric when a given polarisation is applied to it.

3. Manufacturing method according to claim 1, wherein the polarisation layer is formed between the first layer and the third layer.

4. Manufacturing method according to claim 1, wherein the polarisation layer (6) is formed between the substrate and the first layer.

5. Manufacturing method according to claim 1, wherein the conductors in the first layer are in the form of strips and wherein the polarisation layer is formed so as to be in contact with at least part of each of the strips.

6. Manufacturing method according to claim 5, wherein the polarisation layer is formed so as to be in contact with a longitudinal end of the strips.

7. Manufacturing method according to claim 1, comprising a step to produce two electrical contacts in electrical contact with the polarisation layer, said electrical contacts being configured to at least verify the electrical conductivity of said polarisation layer at least after the treatment.

8. Manufacturing method according to claim 1, comprising a step to produce at least two transistors, each transistor being connected to an electrical conductor, the polarisation layer being formed so as to be electrically connected at least to the transistor drains, wherein during step c), the polarisation layer, the drains, the sources and the gates are short circuited.

9. Manufacturing method according to claim 1, wherein the polarisation layer is a cross-linkable glue containing one or several cross-linking initiation salts and the treatment is ultraviolet radiation exposure.

10. Manufacturing method according to claim 9, wherein the substrate is made of a material transparent to ultraviolet radiation and wherein the ultraviolet radiation exposure is made through the substrate.

11. Manufacturing method according to claim 9, wherein, during step d), only the portions of the polarisation layer located between the conductors are made electrically insulating.

12. Manufacturing method according to claim 9, wherein the ultraviolet radiation exposure is made through a mask.

13. Manufacturing method according to claim 1, wherein the material of the third layer comprises polyvinylidene fluoride or one of its derivatives.

14. Method of manufacturing a thermal patterns sensor including manufacturing of device comprising a stack using the method according to claim 1, a step to produce electrical conducting lines forming a heat source on said stack, and a step to produce an encapsulation layer.

15. Stack configured to be used in a device comprising at least one first layer comprising at least two electrical conductors electrically insulated from each other, a second layer comprising at least one electrical conductor, a third layer made of a material with at least one electrical property after electrical polarisation, said third layer being located between the first layer and the second layer, said stack being obtained using the manufacturing method according to claim 1, said stack comprising the first layer, the second layer, the third layer, the material of the third layer not having said electrical property and a polarisation layer made of a material with a first state in which it is electrically conducting and a second state in which it is electrically insulating, the change from the first state to the second state being obtained by applying a treatment to said second material, said polarisation layer being made so that it is initially in its first state, said polarisation layer being in electrical contact with the electrical conductors in the first layer.

16. Stack according to claim 15, wherein the material of the third layer is polyvinylidene fluoride or one of its derivatives, and the material in the polarisation layer is a cross-linkable glue containing one or several cross-linking initiation salts, for example an epoxy glue, said treatment being an ultraviolet radiation exposure.

* * * * *